United States Patent [19]

Fukaya et al.

[11] 4,330,757
[45] May 18, 1982

[54] SEMICONDUCTOR POWER AMPLIFICATION CIRCUIT

[75] Inventors: Hirokazu Fukaya; Hisashi Togari, both of Tokyo, Japan

[73] Assignee: Nippon Electric Co., Ltd., Tokyo, Japan

[21] Appl. No.: 154,392

[22] PCT Filed: Dec. 8, 1978

[86] PCT No.: PCT/JP78/00046
§ 371 Date: Aug. 9, 1979
§ 102(e) Date: Aug. 9, 1979

[87] PCT Pub. No.: WO79/00362
PCT Pub. Date: Jun. 28, 1979

[30] Foreign Application Priority Data
Dec. 9, 1977 [JP] Japan .................. 52/148371

[51] Int. Cl.³ .......................... H03F 3/30
[52] U.S. Cl. .................... 330/298; 330/267
[58] Field of Search ............ 330/207 P, 267, 273, 330/288, 298

[56] References Cited
U.S. PATENT DOCUMENTS
3,845,405 10/1974 Leidich .................. 330/298
4,092,612 5/1978 Schade, Jr. .............. 330/288

Primary Examiner—James B. Mullins
Attorney, Agent, or Firm—Sughrue, Mion, Zinn, Macpeak & Seas

[57] ABSTRACT

The present invention prevents the destruction of an output transistor when the output terminal of a single-ended push-pull type power amplification circuit connects to a ground line or other section to form a short circuit. That is, the base-emitter of a current-detection transistor of the same conduction type as that of the transistor to be protected is connected between the base and emitter of the output transistor to be protected. The collector current of this current-detection transistor is applied to a current-voltage conversion means through a current mirror circuit, and the voltage of the current-voltage conversion means is compared with that of the output terminal by a comparator transistor. With the output of the comparator transistor, the supply of a base current to the transistor to be protected is stopped.

10 Claims, 5 Drawing Figures

SEMICONDUCTOR POWER AMPLIFICATION CIRCUIT

BACKGROUND OF THE INVENTION

The present invention relates to a power amplification circuit using semiconductor devices and, in particular to a semiconductor power amplification circuit equipped with an output short-circuit protection circuit to protect a transistor which is a part of the circuit, from being destroyed when the output terminal is short-circuited with one terminal of the power supply means.

The conventional transistorized power amplification circuit has a circuit construction of the output stage in which an output transistor operating as an NPN-type transistor and an output transistor as a PNP-type transistor are connected in series between the power supply lines, and the common connecting point of these two transistors is used as an output terminal, and in which a series circuit of a large capacitance capacitor and a loud speaker is connected between the above output terminal and one of the power supply line. However, such a basic circuit configuration of a power amplification circuit output stage alone has a drawback that, when the output terminal is connected directly to the one of the power supply lines to form a short circuit, an unlimited current flows through the output transistor positioned opposite to the power supply line connected to the output terminal, resulting in a breakdown of this output transistor.

As conventional means for overcoming such a drawback, there has been proposed a protection circuit in which a resistor having a resistance of 0.5 to several ohms is inserted between the output electrode of the output transistor such as the emitter and the output terminal, and, by detecting the voltage drop across the above resistor, the base and the emitter electrodes of the transistor through which large current is flowing are short-circuited to cause it to be in a cut-off condition, and thereby the breakdown of the output transistor is prevented. Such a protective circuiit has another shortcoming that of an output power loss due to the presence of the resistor positioned between the output electrode of the output transistor and the output terminal.

SUMMARY OF THE INVENTION

The object of the present invention is to obtain a semiconductor power amplification circuit equipped with a protection circuit to protect the output transistor from the destruction without consuming the output power when the output terminal is directly connected to the power supply line to form a short circuit.

The present invention provides a semiconductor power amplification circuit comprising: first and second transistors operating respectively in accordance with respective parts of the input signal and serially connected between power supply lines so as to produce an output signal according to the input signal; an output terminal connected to the common connecting terminal of these first and second transistors; a third transistor having a base connected to the base of the transistor to be protected, which is either one of the first and second transistors, and an emitter connected to the emitter of the transistor to be protected directly or through a resistor, the conduction type of the third transistor being the same as that of the transistor to be protected; a current mirror circuit having an input-side circuit connected between the collector of the third transistor and the power supply line supplying a current to the collector of the transistor to be protected; a fourth transistor having its base electrically connected to the output terminal of the current mirror circuit, its emitter electrically connected to the output terminal and its collector connected to a circuit section supplying a base current to the base of the transistor to be protected; and current-voltage conversion means connected to the base of the fourth transistor.

According to the present invention, the current equal to that flowing in the emitter of the transistor to be protected also flows to the emitter of the third transistor, and a current approximately equal to the emitter current is supplied to the input circuit of the current mirror circuit from the collector of the third transistor, and the same current is then supplied from the output end of the current mirror circuit to the base of the fourth transistor. Therefore, when the output terminal is directly connected to the power supply line to flow a large current through the transistor to be protected, a large current flows to the base of the fourth transistor in response to the above large current, rendering the fourth transistor conductive. Consequently, the base current is prevented from supplying to the transistor to be protected. Further, the fourth transistor compares the voltage potential at the output terminal connected to the emitter thereof with the voltage converted by the current-voltage conversion means from the output current of the current mirror circuit supplied to the base thereof. When operating normally, because there is no difference between the output terminal voltage and the voltage connected by the current-voltage conversion means, the fourth transistor does not operate. A difference is generated between these two voltages only when the output is short-circuited, and then the fourth transistor operates and protects the transistor to be protected. Accordingly, the first or second transistors can be prevented from destruction surely without imparing the normal operation of the power amplification circuit from the breakdown caused by a short circuit between the output-terminal and power supply line. Furthermore, according to the present invention, there is no necessity to insert a current detection resistor between the transistor to be protected, which is either the first or second transistor, and the output terminal, resulting in that the output signal obtained by the first and second transistors can be supplied to a load, such as a speaker, without any loss.

BRIEF DESCRIPTION OF THE DRAWING

The present invention will now be explained in more detail by referring to drawings.

DESCRIPTION OF THE PREFERRED EMBODIMENT

Figure 1:
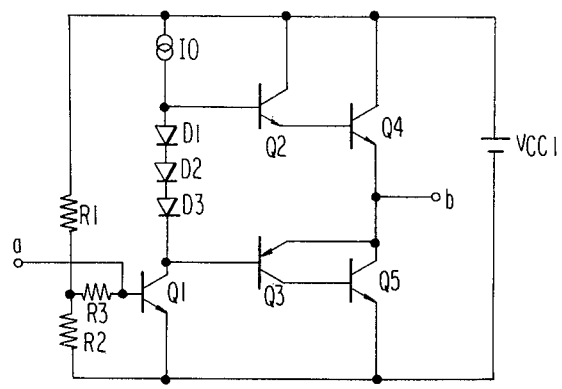
FIG. 1 is a circuit diagram of a conventional power amplification circuit without a protection circuit.

Referring to FIG. 1, a conventional power amplification circuit equipped with no protective circuit is constructed as described below. An NPN transistor $Q_2$ and an NPN output transistor $Q_4$ forming a Darlington connection, and a PNP transistor $Q_3$ and an NPN output transistor $Q_5$ forming a complementary connection are connected in series between both the poles of a power supply $V_{CCl}$, and a bias settng device of diodes $D_1$, $D_2$ and $D_3$ connected in series is inserted between the bases of these NPN transistors $Q_2$ and PNP transistor $Q_3$, and the input signal is applied through an input terminal a to the base of the NPN transistor $Q_1$ to which a base bias voltage is given by a resistors $R_1$, $R_2$ and $R_3$ and the output of the transistor $Q_1$ is applied to the bias setting device. A constant current source $I_0$ which is, for instance, a resistor, and which operates as a constant current load is inserted between the base and the collector of the NPN transistor $Q_2$. The output is available from an output terminal b connected to the connecting point of the emitter of the NPN output transistor $Q_4$ and the collector of the NPN output transistor $Q_5$ and is applied to a loud speaker through, for instance, a large-capacitance capacitor.

Should the output terminal b of such a power amplifier accidentally make contact with the negative pole of the power supply $V_{CCl}$, a large forward bias voltage is applied between the bases and emitters of both NPN transistor $Q_2$ and NPN output transistor $Q_4$ connected in a Darlington fashion. Consequently, all the current from the constant current source $I_0$ flows to the base of the NPN transistor $Q_2$, and this current is amplified and flows to the NPN output transistor $Q_4$, resulting in an extremely large current flowing to the emitteer of the NPN output transistor $Q_4$. For this reason, the power consumption of the NPN output transistor $Q_4$ becomes excessive, and the NPN output transistor $Q_4$ is destroyed in an extremely short time.

As means for protecting against the destruction of the NPN transistor $Q_4$, has been proposed to connect a resistor with a resistance range of 0.5 ~ several ohms between the emitter of the NPN output transistor $Q_4$ and the output terminal b, and to add an NPN transistor whose emitter and base are connected to both the ends of this resistor and whose collector is connected to the base of the NPN transistor $Q_2$. According to such protecting means, in accordance with an increase of the emitter current of the NPN output transistor, the voltage drop across the resistor increases. If this voltage drop exceeds the threshold voltage betwen the base and emitter of the added NPN transistor, the collector-emitter path of the added NPN transistor becomes conductive, and the NPN transistor $Q_2$ and the NPN output transistor $Q_4$ are driven to cutoff condition to inhibit the increase of the emitter current of the NPN output transistor $Q_4$, and thereby the NPN output transistor $Q_4$ is protected from the destruction.

In the said protective means, however, the resistor intervenes between the emitter of the NPN output transistor $Q_4$ and the output terinal b, the output from the NPN output transistor $Q_4$ is partly consumed by this resistor, while the rest of the output is supplied to the load connected to the output terminal b. Therefore, there is a shortocming in that there is a decrease in the output supplied to the load.

Figure 2:
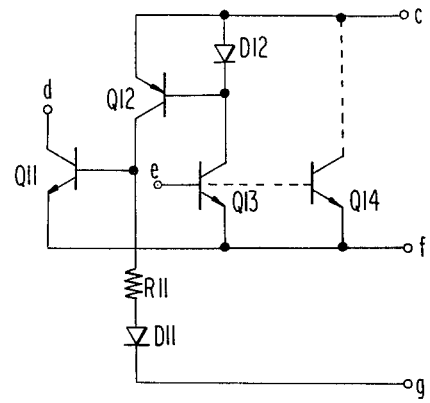
FIG. 2 is a circuit diagram showing the principle of the present invention.

Referring to FIG. 2 it shows the principle of the present invention. A transistor $Q_{13}$ whose base and emitter are respectively connected in common to the base and emitter of the transistor $Q_{14}$ to be protected is included, and the collector of this transistor $Q_{13}$ is connected to the input on the diode $D_{12}$ side of the current mirror circuit consisting of diode $D_{12}$ and transistor $Q_{12}$, while the output of the current mirror circuit taken out from the collector of the transistor $Q_{12}$ is connected to the terminal g which is connected to the ground potential or negative potential of the power supply through the serial circuit of a resistor $R_{11}$ and a diode $D_{11}$, is also connected to the base of the transistor $Q_{11}$. The emitter of the transistor $Q_{11}$ is connected to the terminal f to which is also connected the emitter of the transistor $Q_{14}$ to be protected. The collector of $Q_{11}$ is connected through the terminal d to a circuit which supplies a base current to the transistor $Q_{14}$ to be protected. It is to be noted that the terminal c is a terminal connected to one pole of the power supply.

According to this circuit configuration, when the terminal f connected to the output terminal is not connected to either the terminal c or g supplying the power supply voltage, the voltage generated across both the ends of a serial circuit consisting of the resistor $R_{11}$ and the diode $D_{11}$ is designed to be equal to that of the terminal f, and thus the transistor $Q_{11}$ maintains the cut-off state. Consequently, in the case when there is no short circuit between the output terminal and either one of the terminals of the power supply means, the protection circuit does not operate, and the normal operation of the power amplification circuit is assured. On the other had, if terminal f connected to the output terminal of the circuit including the transistor $Q_{14}$ to be protected makes contact with the terminal g connected to the negative side of the power supply of the circuit including the transistor $Q_{14}$ to be protected, a current starts flowing into the trasnsitor $Q_{14}$ to be protected (as shown by the dotted line). This operation can be explained as follows. The terminasl e and f are connected to the base and emitter of transistor $Q_{14}$, respectively. The potential at the terminal f becomes equal to that on the negative side of the power supply, but that of the terminal e changes to a voltage equivalent to the large voltage drop generated in the serial circuit of the resistor $R_{11}$ and the diode $D_{11}$. This large voltage drop is caused by a result of the following operation. When the terminal f is connected to the negative side of the power supply, a large bias voltage is applied instantaneously between the base and emitter of the transistor $Q_{13}$ to flow through the transistor $Q_{13}$ a current proportional to the large current flowing through the transistor $Q_{14}$ to protected, and to drive thre transistor $Q_{12}$ so as to generate a large voltage drop on the resistor $R_{11}$ and the diode $D_{11}$. Such a large potential difference between the terminal e and f effects a forward bias voltage between the base and emitter of the transistor $Q_{11}$ to make the transistor $Q_{11}$ conductive and to allow a collector current to flow to terminal d, and thus a base drive current of a transistor to be protected, which is connected to the terminal d is inhibited to flow, or the operation of the base drive current supply circuit is suppressed. Thus, the transistor $Q_{14}$ is protected from destruction by preventing an excessively large current from flowing to transistor $Q_{14}$. It is noted that diode $D_{11}$ is not needed in principle, but, in this case, it is added for temperature compensation of a voltage $V_{BE}$ between the base and emitter of the transistor $Q_{11}$.

Furthermore, in the protective circuit shown in FIG. 2, because there is no need to connect a resistive element to the emitter of the transistor to be protected to allow the direct connection of this transistor to the output terminal, all of the power obtained from the transistor $Q_{14}$ to be protected can be supplied to the load.

Figure 3:
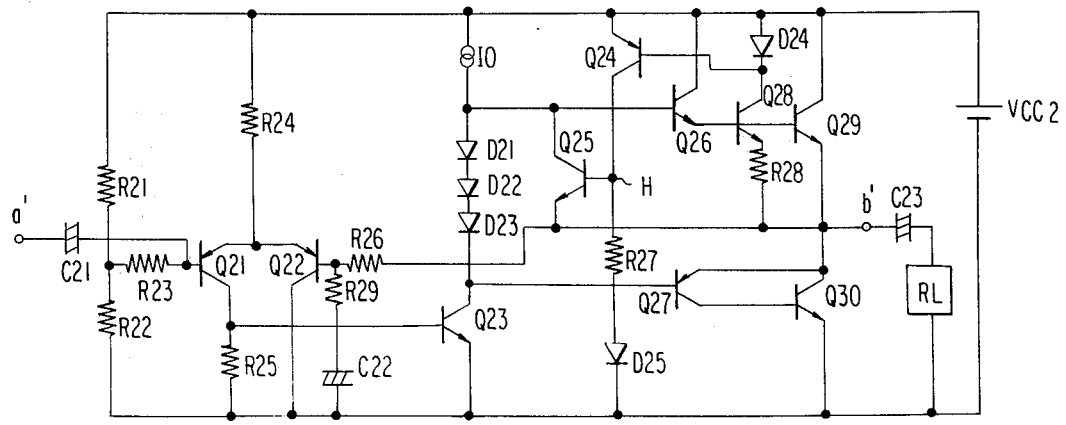
FIG. 3 shows a circuit diagram of a first embodiment according to the present invention.

In the next place, referring to FIG. 3, one preferred embodiment of the present invention utilizing its principle will be explained. The signal applied from an input terminal a' is applied to the base of transistor $Q_{21}$, to which a base bias is given by reistors $R_{21}$, $R_{22}$, and $R_{23}$, through a large-capacitance capacitor $C_{21}$. The emitter of transistor $Q_{21}$ and that of transistor $Q_{22}$ are commonly connected and are connected to the positive pole of the power supply $V_{CC2}$ through a resistor $R_{24}$, thus forming a differential amplifier. The collector output of the transistor $Q_{21}$ is taken out at both ends of a load resistance $R_{25}$ and is applied to the base of a drive transistor $Q_{23}$. The collector of the drive transistor $Q_{23}$ is connected to the positive pole of the power supply $V_{CC2}$ through a bias setting circuit consisting of diodes $D_{21}$, $D_{22}$ and $D_{23}$ connected in series and a constant current load consisting of a constant current source $I_0$. The collector output of the drive transistor $Q_{23}$ is taken out at both ends of this bias setting circit and is connected to a Darlington connection circuit of an NPN transistor $Q_{26}$ and NPN output transistor $Q_{29}$ and to a complementary connection circuit consisting of a PNP transistor $Q_{27}$ and NPN output transistor $Q_{30}$. The common connection point between the emitter of the NPN output transistor $Q_{29}$ and the collector of the NPN output transistor $Q_{30}$ supplies an output via an output terminal b' to a load $R_L$ through a large-capacitance capacitor $C_{23}$, and is fed back to the base of the transistor $Q_{22}$ to form a negative feedback by resistors $R_{26}$ and $R_{29}$ and the capacitor $C_{22}$.

As a protective circuit for the NPN output transistor $Q_{29}$, the base of the NPN transistor $Q_{28}$ is connected to the base of the NPN transistor $Q_{29}$, and the emitter of this transistor $Q_{28}$ is connected to the output terminal b, via a resistor $R_{28}$ of 150 Ω, and the collector of $Q_{28}$ is connected to the diode $D_{24}$ side of the current mirror circuit consisting of the diode $D_{24}$ and the transistor $Q_{24}$. The collector of the transistor $Q_{24}$, which is the output terminal of the current mirror circuit, is connected to the negative pole of the power supply $V_{CC2}$ via a 3 KΩ resistor $R_{27}$ and a diode $D_{25}$, and also connected to the base of the transistor $Q_{25}$. The electrical path between emitter and collector of transistor $Q_{25}$ is connected between the output terminal b' and the base of the transistor $Q_{26}$.

Figure 5:
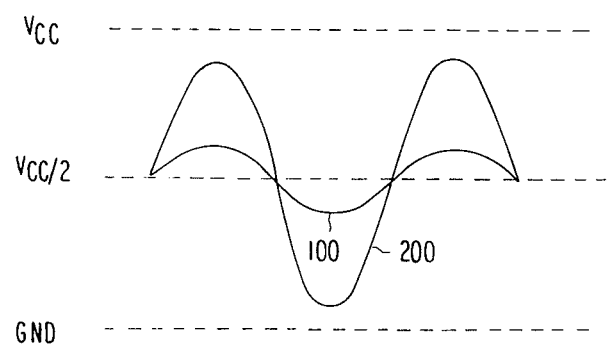
FIG. 5 is a waveform diagram showing circuit operations of the first and second embodiments of the present invention.

The output stage of this embodiment is a well-known class-B single-ended push-pull configuration. Now, under normal operation of this circuit, when, for instance, sine-wave input signals 100 shown in FIG. 5 are available at the input terminal a', sine-wave output signals 200 as shown in FIG. 5 are output at the output terminal b'. If the voltage of the power supply is equal to Vcc, an upper waveform of the output above Vcc/2 is generated while the transistor $Q_{29}$ is in the conductive state, and a lower waveform of it is generated while the transistor $Q_{30}$ is in the conductive state. The voltage $V_{BDQ}^{29}$ between the base and emitter of the transistor $Q_{29}$ increases while the transistor $Q_{29}$ is in conductive state. Similarly, if the voltage between the base and emitter of the transistor $Q_{28}$ is referred to as $V_{BEQ}^{28}$ and the resistance value of the resistor $R_{28}$ is to $R_{28}$, a current I, shown in the following equation flows to the collector of the transistor $Q_{28}$:

$$I_1 = \frac{V_{BEQ29} - V_{BEQ28}}{R_{28}}$$

Now, when the current $I_1$ flows in the collector of the transistor $Q_{28}$, the same current $I_1$ flows in the collector of the transistor $Q_{24}$ from the current mirror circuit consisting of the diode $D_{24}$ and the transistor $Q_{24}$ (provided the current amplification factor $h_{FE}$ of the transistor $Q_{24}$ is sufficiently large). Assuming the voltage drop of the diode $D_{25}$ to be $V_D^{25}$ and the resistance value of the resistor $R_{27}$ to be $R_{27}$, a voltage drop of $(I_1R_{27} + V_D^{25})$ is generated at the point H. In this instance, the output at the output terminal b' derives the upper waveform as described hereinbefore. Therefore, if the resistance value of the resistors $R_{27}$ and $R_{28}$ is designed so that the potential at the point H may always be kept lower than the potential $(V_b)$ of the output terminal, that is, $I_1R_{27} + V_D^{25} < V_b + V_{BEQ}^{25}$ comes into existance, this protective circuit does not operate under normal operating conditions because the potential at the emitter of the transistor $Q_{25}$, that is, the output terminal b', and the base of the transistor $Q_{25}$, that is, the point H', are always inverse-biased.

At the abnormal conditions when the output terminal b' contacts with the negative terminal (-terminal) of the power supply, the output terminal b' becomes the lowest poetential, and the transistors $Q_{28}$ and $Q_{29}$ in the upper Darlington connection are driven continuously by a current $I_0$, causing a current flow of a large value through the transistor $Q_{29}$. Simultaneously, a current $I_1$ proportional to this large current flows in the collector of the transistor $Q_{28}$, and the current $I_1$ flows in the collector of the transistor $Q_{24}$ by the operation of the current mirror circuit consisting of the diode $D_{24}$ and the transistor $Q_{24}$, if the current amplification factor $h_{FE}$ is sufficiently large. Consequently, a voltage drop occurs on the resistor $R_{27}$ and the diode $D_{25}$, and a forward bias voltage is applied between the base and emitter of the transistor $Q_{25}$ to drive the transistor $Q_{25}$. With the absorbing of the base drive current of the transistor $Q_{26}$ by the collector current of the transistor $Q_{25}$, the drive current flowing into the base of the last-stage transistor $Q_{29}$ is prevented, and thereby, the transistor $Q_{29}$ is protected from destruction by inhibiting the operation thereof. That is, when $I_1R_{27} + V_{BED}^{25} > V_b + V_{BEQ}^{25}$ comes into existance by virtue of the current $I_1$ flowing through the transistor $Q_{24}$ which depends on the current of the transistor $Q_{29}$, the transistor $Q_{25}$ is operated to protect the transistor $Q_{29}$.

As described above, by connecting a circuit according to the present invention, a protective circuit can be realized which prevents the destruction of a transistor in an emergency where an output terminal of the amplification circuit makes contacts with one line of a power supply. Moreover, there is no need to insert an impedance element such as a resistor to the emitter of the transistor $Q_{29}$ for such protection of the transistor $Q_{29}$, and thereby, the entire output from transistor $Q_{29}$ is supplied to the load $R_L$ without output losses.

Figure 4:
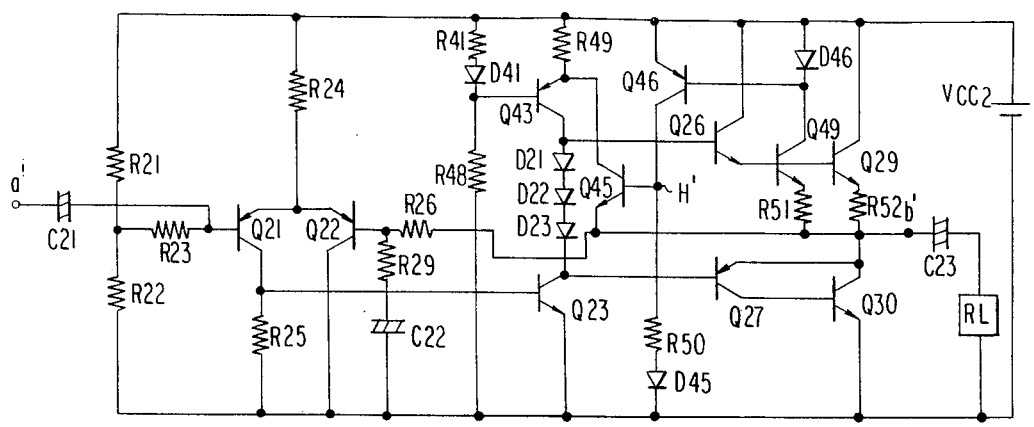
FIG. 4 presents a circuit diagram of a second embodiment according to the present invention.

In the following, the second embodiment of the present invention will be explained by referring to FIG. 4. In FIG. 4, a configuration of a power amplifier which is the same as that of the first embodiment shown by referring to FIG. 3 with the exception of a constant current load connected between diode $D_{21}$ and the anode of the power supply $V_{CC2}$, and resistor $R_{52}$ connected to the emitter of the PNP output transistor $Q_{29}$, and the protective circuit. An explanation of this circuit, therefore will be omitted by referring to FIG. 3 and noting that same references in FIG. 4 performs similar function.

The constant current load is constructed by a transistor $Q_{43}$, a diode $D_{41}$, and resistors $R_{47}$, $R_{48}$, and composed so as to obtain a constant current at the collector of the transistor $Q_{43}$ by applying a constant voltage obtained by the diode $D_{41}$ and the resistors $R_{47}$ and $R_{48}$ to the base of the transistor $Q_{43}$. The resistor $R_{49}$ is added to adjust the output constant current value.

To the base of the NPN output transistor $Q_{29}$ is connected the base of the transistor $Q_{49}$ which is of the same NPN-type. The emitter of transistor $Q_{49}$ is connected to the output terminal b' through a resistor $R_{51}$, and its collector to a diode $D_{46}$ and the base of a transistor $Q_{46}$. The diode $D_{46}$ and the transistor $Q_{46}$ form a current mirror circuit and output the same current as the collector current of the transistor $Q_{49}$ to the collector of the transistor $Q_{46}$. The collector of the transistor $Q_{46}$ is connected to the negative pole of the power supply $V_{CC2}$ through a resistor $R_{50}$ and a diode $D_{45}$, and directly to the base of the transistor $Q_{45}$. The emitter of transistor $Q_{45}$ is connected to the output terminal b', and its collector to the emitter of the transistor $Q_{43}$ in the constant current load circuit. Under normal operating conditions, when, for instance, sine-wave signals 100 shown in FIG. 5 are input to the input terminal a', sine-wave signals 200 shown in FIG. 5 are available at the output terminal b'. In this operation, making an output level $V_{CC/2}$ as a borderline, the upper waveforms are generated when the transistor $Q_{29}$ conducts, while the lower waveforms are generated when the transistor $Q_{30}$ conducts. Making the current flowing to the emitter of the transistor $Q_{29}$ when the transistor $Q_{29}$ conducts to be $I_1$, the base-emitter voltage $V_{BEQ29}$ and the voltage drop $I_1 R_{52}$ on the resistor $R_{52}$ increase. At this time, assuming the base-emitter voltage to $V_{BEQ49}$, a current $I_2$ shown in the following equation flows to the collector of transistor $Q_{49}$:

$$I_2 = \frac{(V_{BEQ29} + I_1 R_{52}) - V_{BEQ49}}{R_{51}}$$

When a current $I_2$ flows in the collector of the transistor $Q_{49}$, the same current $I_2$ flows in the collector of the transistor $Q_{46}$ by the operation of the current mirror circuit consisting of the diode $D_{46}$ and the transistor $Q_{46}$ (provided that the current amplification factor $h_{FE}$ of the transistor $Q_{46}$ is sufficiently large). Assuming the voltage drop of the diode $D_{45}$ to be $V_{D45}$, the voltage drop ($I_2 R_{50} + V_{D45}$) occurs at connection point H' of the collector of transistor $Q_{46}$, the base of transistor $Q_{45}$ and the resistor $R_{50}$. At the same time, because the output terminal b' derives an upper waveform of an output as described above, by adjusting resistors $R_{50}$, $R_{51}$ and $R_{52}$ so that the potential of the connection H' is kept lower than the potential $V_b$ at the output terminal, that is, $I_2 R_{50} + V_{D45} < V_b + V_{BEQ45'}$, comes into existance, the potential difference between the emitter of the transistor $Q_{45}$, that is, the output terminal b', and the base of the transistor $Q_{45}$, that is, the connecting point H', is constantly kept to inverse bias, and thereby, the protection circuit does not operate under normal operating conditions.

Now, at the abnormal condition when the output terminal b' contacts with the negative terminal ("−" terminal) of the power supply, the output terminal b' changes its potential to the minimum, and the transistors $Q_{26}$ and $Q_{29}$ in the upper Darlington connection will be continuously driven by a current;

$$\left\{ \left( \frac{V_{CC} - V_{D41}}{R_{47} + R_{48}} \times R_{47} + V_{D41} \right) - V_{BEQ43} \right\} / R_{49} = I_0$$

where the voltage drop of the diode $D_{41}$ is $V_{D41}$ and the base-emitter voltage of transistor $Q_{43}$ is $V_{BEQ43}$, and thereby a large current starts flowing in transistor $Q_{29}$. However, a current $I_3$ proportional to this large current, coincidently, flows in the collector of the transistor $Q_{49}$, and by the operation of the current mirror circuit composed of the diode $D_{46}$ and the transistor $Q_{46}$, the same current $I_3$ flows in its collector to generate the voltage drop on the resistor $R_{50}$ and the diode $D_{45}$, and thus a forward bias voltage is applied between the base and emitter of the transistor $Q_{45}$ to drive the transistor $Q_{45}$. Accordingly, the voltage drop on resistor $R_{49}$ increases by the above collector current to make the transistor $Q_{43}$ inoperative, to suppress the supply of the base drive current to the transistor $Q_{26}$, and to suppress the supply of the base drive current to the transistor $Q_{29}$ in the final stage. Consequently, the transistor $Q_{29}$ is made inoperative to prevent the transistor $Q_{29}$ from the destruction caused by the extraordinarily large current. That is, when $I_2 R_{50} + V_{D45} > V_b + V_{BEQ45}$ comes into existance by the current $I_2$ flowing to the transistor $Q_{24}$ according to the current of the transistor $Q_{29}$, the transistor $Q_{45}$ operates to protect the transistor $Q_{29}$.

As explained above, since the constant current load is also made inoperative in this embodiment, not only the transistor $Q_{29}$ but also the transistor $Q_{43}$ can be protected when the output terminal directly connected to the negative pole of the power supply $V_{CC2}$ to form a short circuit. Moreover, if the constant current load in FIG. 4 is used as a constant current load $I_0$ in the first embodiment shown in FIG. 3, at the moment of a short circuit between the output terminal b' and the negative pole of the power supply $V_{CC2}$, the collector potential decreases while the potential difference between the collector and the emitter increases in spite of no change of the collector current of the transistor $Q_{43}$, and thereby the power consumption of the transistor $Q_{43}$ becomes large. It will be necessary to set the output constant current so as to protect transistor $Q_{43}$ even against this large power consumption. However, according to the second embodiment, since transistor $Q_{43}$ becomes inoperative when the protection circuit operates, it will not be necessary to make such a setting, and the sufficiently large constant-current output can be provided in normal operating time. For this reason, there is no lack of drive of the transistors $Q_{26}$ and $Q_{27}$ at all.

In addition, resistor $R_{52}$ is used to adjust the operating point of the protection circuit, and it can be omitted by appropriately selecting the resistance value of the resistor $R_{51}$.

Though some embodiments of the present invention have been presented above, it is apparent that the present invention should not be limited to these embodiments. For instance, where as in a power amplification circuit, the output stage of it is constructed by a single-ended push-pull (SEPP) circuit which serially connects two output transistors, the preceeding stage of it can utilize any other circuit configurations. Moreover, in the above embodiments, though the single-ended push-pull circuit was formed by combining a Darlington-connected output transistor and a complementary-connected output transistor, the present invention can also be applied to the single-ended push-pull circuit which combines two Darlington-connected output transistors. In this instance, both the upper and the lower Darlington-connected output transistors can be protected by using a similar circuit and by changing the polarity of each transistor and that of the power supply line connected to the current mirror circuit.

We claim:

1. A semiconductor power amplification circuit comprising: a signal input terminal; a first and a second transistor operating by respective parts of the input signal applied to said input terminal so as to output an output signal according to said input signal, and being serially connected between a first and a second power supply line, said first power supply line feeding current to the collector of said first transistor; a circuit supplying a current to the base of said first transistor; an output terminal electrically connected to a common connecting terminal of said first and second transistors; a third transistor having its base connected to the base of said first transistor said third transistor being of the same conductivity type as said first transistor; means for DC-connecting the emitter of said third transistor to the emitter of said first transistor; a current mirror circuit having an input circuit connected between the collector of said third transistor and said first power supply line; a fourth transistor having a base receiving the output of said current mirror circuit at a first connecting point, an emitter electrically connected to said output terminal, and a collector electrically connected to said circuit supplying a current to the base of said first transistor; and a current-voltage conversion means connected between said first connecting point and said second power supply line.

2. A semiconductor power amplification circuit described in claim 1, where said first, second and third transistors are of the NPN type, said first power supply line feeding a positive voltage of the power supply, and said current-voltage conversion means includes a series connection of a resistor and a diode.

3. A semiconductor power amplification circuit described in claim 2, wherein said fourth transistor is of the NPN type.

4. A power amplification circuit comprising; a signal input terminal; a drive transistor amplifying the input signals applied to said signal input terminal; a bias voltage setting means having one end thereof connected to the collector of said drive transistor; a constant current load means connected to the other end of the said bias voltage setting means and operating as a load of said drive transistor; a first transistor amplifying the output obtained at said other end of said bias voltage setting means; said constant current load means supplying base current to said first transistor; a second transistor amplifying the output obtained at said one end of said bias voltage setting means, the collector-emitter paths of said first and second transistors being connected in series between a first and a second power supply line; said first supply line supplying current to the collector of said first transistor; an output terminal electrically connected to the common connecting terminal of said first and second transistors; a third transistor having a base connected to the base of said first transistor said third transistor being of the same conductivity type as said first transistor; means for DC-connecting the emitter of said third transistor to that of said first transistor; a current mirror circuit having an input circuit connected between the collector of said third transistor and said first power supply line; a fourth transistor having a base connected to the output of said current mirror circuit at a first connecting point, an emitter electrically connected to said output terminal, and a collector connected to said constant current load means; and a current-voltage conversion means connected between said first connecting point and said second power supply line.

5. The circuit of claims 1 or 4, wherein said fourth transistor is rendered non-conductive when the potential at said first connecting point is less than the potential at said output terminal; said fourth transistor rendered conductive when the potential at said first connecting potential is greater than the potential at said output terminal.

6. The circuit of claim 1 further including a drive transistor amplifying the input signals applied to said signal input terminal, a bias voltage setting mean having one end thereof connected to the collector of said drive transistor and a constant current circuit connected to the other end of said bias voltage setting means.

7. The circuit of claims 4 or 6 wherein a fifth transistor is connected between said other end of said bias voltage setting means and the base of said third transistor; said fifth transistor having its emitter connected to the base of said third transistor, its collector connected to said first power line and its base connected to said other end of said bias voltage setting means; said fifth transistor rendered non-conductive when said fourth transistor is conductive.

8. The circuit of claims 1 or 4 wherein a first resistor is connected between the emitter of said third transistor and said output terminal.

9. The circuit of claim 4 wherein a first resistor is connected between the emitter of said third transistor and said output terminal and a second resistor is connected between the emitter of said first transistor and said output terminal.

10. The circuit of claim 4 or 6 wherein said constant current load means comprises a sixth transistor having its collector connected to said other end of said bias voltage setting means, its emitter connected to said first power supply line, and its base connected to said first power supply line through a diode and a resistor and also connected to said second power supply line through a resistor.

* * * * *

UNITED STATES PATENT AND TRADEMARK OFFICE
CERTIFICATE OF CORRECTION

PATENT NO. : 4,330,757

DATED : May 18, 1982

INVENTOR(S) : FUKAYA ET AL.

It is certified that error appears in the above—identified patent and that said Letters Patent is hereby corrected as shown below:

IN THE SPECIFICATION:

Column 1, line 42, after "coming" insert a --,--.

Column 2, lines 41-42, change "imparing" to --impairing--.

Column 3, line 14, change "a" to --$\bar{a}$--.

line 16, delete "a"

line 22, change "b" to --$\bar{b}$-- line 28, change "b" to --$\bar{b}$-- line 37, change "emitteer" to --emitter-- line 43, after "$Q_4$" insert --it-- line 46, change "b" to --$\bar{b}$-- line 53, change "betwen" to --between--

UNITED STATES PATENT AND TRADEMARK OFFICE
CERTIFICATE OF CORRECTION

PATENT NO. : 4,330,757  Page 2 of 7
DATED : May 18, 1982
INVENTOR(S) : FUKAYA ET AL.

It is certified that error appears in the above—identified patent and that said Letters Patent is hereby corrected as shown below:

line 63, change "terinal b" to --terminal $\bar{b}$-- line 66, change "b" to --$\bar{b}$-- line 67, change "shortocming" to --shortcoming--.

Column 4, line 10, change "g" to --$\bar{g}$-- line 13, after "$D_{11}$," insert --and-- line 15, change "f" to --$\bar{f}$-- line 17, change "d" to --$\bar{d}$-- line 19, change "c" to --$\bar{c}$-- line 22, change "f" to --$\bar{f}$-- line 23, change "c or g" to --$\bar{c}$ or $\bar{g}$-- line 27, change "f" to --$\bar{f}$--

UNITED STATES PATENT AND TRADEMARK OFFICE
CERTIFICATE OF CORRECTION

PATENT NO. : 4,330,757

DATED : May 18, 1982

INVENTOR(S) : FUKAYA ET AL.

It is certified that error appears in the above—identified patent and that said Letters Patent is hereby corrected as shown below:

line 33, change "had" to --hand-- and change "f" to --$\bar{f}$-- line 35, change "g" to --$\bar{g}$-- line 38, change "trasnsitor" to --transistor-- line 40, change "terminasl e and f" to --terminals $\bar{e}$ and $\bar{f}$-- line 42, change "f" to --$\bar{f}$-- line 44, change "e" to --$\bar{e}$-- line 48, change "f" to --$\bar{f}$-- line 53, before "protected" inserted --be-- line 56, change "terminal" to --terminals--

UNITED STATES PATENT AND TRADEMARK OFFICE
CERTIFICATE OF CORRECTION

PATENT NO. : 4,330,757

DATED : May 18, 1982

INVENTOR(S) : FUKAYA ET AL.

It is certified that error appears in the above—identified patent and that said Letters Patent is hereby corrected as shown below:

line 59, change "d" to --$\bar{d}$-- line 61, change "d" to --$\bar{d}$--.

Column 5, line 11, change "a'" to --$\bar{a}'$-- line 12, change "reistors" to --resistors-- line 26, change "circit" to --circuit--.

line 34, change "b'" to --$\bar{b}'$-- line 41, change "b" to --$\bar{b}$-- line 51, change "b'" to --$\bar{b}'$-- line 57, change "a'" to --$\bar{a}'$-- line 59, change "b'" to --$\bar{b}$-- line 64, change "$V_{BDQ}{}^{29}$" to --$V_{BEQ29}$--

UNITED STATES PATENT AND TRADEMARK OFFICE
CERTIFICATE OF CORRECTION

PATENT NO. : 4,330,757
DATED : May 18, 1982
INVENTOR(S) : FUKAYA ET AL.

It is certified that error appears in the above—identified patent and that said Letters Patent is hereby corrected as shown below:

line 67, change "$V_{BEQ}{}^{28}$" to --$V_{BEQ_{28}}$-- line 68, after "is" insert --referred-- and after "to" insert --as--.

Column 6, line 14, change "$V_D{}^{25}$" to --$V_{D25}$-- line 16, change "$V_D{}^{25}$" to --$V_{D25}$-- line 17, change "b'" to --$\bar{b}'$-- line 22, change "$V_D{}^{25}$" to --$V_{D25}$-- and "$V_{BEQ}{}^{25}$" to --$V_{BEQ25}$-- line 23, change "existance" to --existence-- line 26, change "b'" to --$\bar{b}'$-- line 27, change "H'" to --$\bar{H}'$--

UNITED STATES PATENT AND TRADEMARK OFFICE
CERTIFICATE OF CORRECTION

PATENT NO. : 4,330,757
DATED : May 18, 1982
INVENTOR(S) : FUKAYA ET AL.

It is certified that error appears in the above—identified patent and that said Letters Patent is hereby corrected as shown below:

line 29, change "b'" to --$\bar{b}'$-- line 30, change "b'" to --$\bar{b}'$-- line 31, change "poetential" to --potential-- line 50, change "$V_{BED_{25}}$" to --$V_{BED_{25}}$-- and change "existance" to --existence--.

Column 7, line 17, change "b'" to --$\bar{b}'$-- line 26, change "b'" to --$\bar{b}'$-- line 31, change "a'" to --$\bar{a}'$-- line 33, change "b'" to --$\bar{b}'$-- line 58, change "b'" to --$\bar{b}'$-- line 63, change "existance" to --existence--

UNITED STATES PATENT AND TRADEMARK OFFICE
CERTIFICATE OF CORRECTION

PATENT NO. : 4,330,757

DATED : May 18, 1982

INVENTOR(S) : FUKAYA ET AL.

It is certified that error appears in the above—identified patent and that said Letters Patent is hereby corrected as shown below:

line 64, change "b'" to --$\bar{b}'$--.

Column 8, line 2, change "b'" to --$\bar{b}'$-- line 3, change "b'" to --$\bar{b}'$-- line 32, change "existance" to --existence-- line 44, change "b'" to --$\bar{b}'$--.

Column 9, line 2, change "preceeding" to --preceding--.

*Signed and Sealed this*

*Seventeenth* Day of *August 1982*

[SEAL]

*Attest:*

*Attesting Officer*

GERALD J. MOSSINGHOFF

*Commissioner of Patents and Trademarks*